US009407379B2

United States Patent
Lau et al.

(10) Patent No.: US 9,407,379 B2
(45) Date of Patent: Aug. 2, 2016

(54) CIRCUIT PROVIDING HARMONIC RESPONSE REJECTION FOR A FREQUENCY MIXER

(71) Applicant: QUALCOMM Incorporated, San Diego, CA (US)

(72) Inventors: Wing Fat Andy Lau, San Diego, CA (US); Jorge Andres Garcia, San Diego, CA (US); David Zixiang Yang, San Diego, CA (US); Ahmed Abdel Monem Youssef, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 14/516,546

(22) Filed: Oct. 16, 2014

(65) Prior Publication Data

US 2016/0112146 A1   Apr. 21, 2016

(51) Int. Cl.
*H04B 1/16* (2006.01)
*H04B 15/06* (2006.01)
*H03D 7/14* (2006.01)

(52) U.S. Cl.
CPC ............. *H04B 15/06* (2013.01); *H03D 7/1458* (2013.01); *H03D 7/1483* (2013.01); *H04B 2215/064* (2013.01)

(58) Field of Classification Search
CPC ........ H04B 1/16; H04B 1/26; H04B 2215/64; G06G 7/16; H03H 7/38; H03D 7/1441
USPC ......... 455/255, 260, 296, 307, 313, 314, 317, 455/318, 323, 326, 333
See application file for complete search history.

(56) References Cited

U.S. PATENT DOCUMENTS

| 5,737,035 | A | 4/1998 | Rotzoll |
| 6,671,505 | B1 | 12/2003 | Koizumi |
| 2005/0128363 | A1 | 6/2005 | Su et al. |
| 2007/0142019 | A1 | 6/2007 | Mattisson et al. |
| 2008/0146184 | A1* | 6/2008 | Dessert .................. H03D 7/163 455/310 |
| 2008/0152049 | A1 | 6/2008 | Sandner et al. |
| 2009/0061790 | A1* | 3/2009 | Rofougaran ......... H04B 1/0053 455/313 |
| 2011/0230157 | A1* | 9/2011 | Zhou ........................ H04B 1/26 455/326 |

FOREIGN PATENT DOCUMENTS

| EP | 1195889 A2 | 4/2002 |
| GB | 2361822 A | 10/2001 |
| WO | 0178242 A2 | 10/2001 |

OTHER PUBLICATIONS

International Search Report and Written Opinion—PCT/US2015/051776—ISA/EPO—Dec. 21, 2015.

* cited by examiner

*Primary Examiner* — Thanh Le
(74) *Attorney, Agent, or Firm* — Arent Fox LLP

(57) ABSTRACT

An apparatus for reducing a harmonic response in an electronic circuit is provided. The apparatus includes an RF input configured to provide a first signal operating at a radio frequency. The apparatus includes a local oscillator configured to produce a second signal operating at a local oscillator (LO) frequency. The apparatus includes a switching mixer configured to mix the first and second signals. The apparatus includes a notch filter comprising an inductor and a capacitor connected in parallel. The notch filter is directly coupled to an input of the switching mixer in series. The notch filter is tuned such that its resonant frequency is a harmonic of the LO frequency signal. In an aspect, the apparatus also includes a transformer configured to provide the first signal. In an aspect the apparatus also includes a second notch filter comprising a second inductor and a second capacitor connected in parallel.

32 Claims, 8 Drawing Sheets

CIRCUIT PROVIDING HARMONIC RESPONSE REJECTION FOR A FREQUENCY MIXER

TECHNICAL FIELD

Various exemplary embodiments disclosed herein relate generally to electronic circuits. In particular, various embodiments relate to frequency mixers.

BACKGROUND

The proliferation of a vast variety of wireless applications, such as cellular communications, WLAN, GPS, has created co-existence issues. This is especially prevalent in modern, miniaturized cellular handset transceivers, as such devices can have multiple, concurrently operating transmitters and receivers working over a wide frequency range.

There are several mechanisms that can result in spurious response in a receiver. A particularly troublesome one is caused by the harmonic response of switching mixers commonly used in transmitter and receiver chains. In a receiver chain, for example, a switching mixer down-converts an input frequency signal to generate an output signal at a lower frequency, $f_{IF}$. However, while the switching mixer down-converts the desired signal at $f_{LO}$, the local oscillator frequency, it also down-converts harmonic frequencies, to $f_{IF}$, causing contamination of the desired signal.

In view of the foregoing, it would be desirable to provide a circuit that filters harmonic responses for a switching mixer. In particular, it would be desirable to produce a low-power, low noise, stable circuit that rejects harmonics responses in a switching mixer.

SUMMARY

In light of the present need for a harmonic response rejection circuit for a switching mixer, a brief summary of various exemplary embodiments is presented. Some simplifications and omissions may be made in the following summary, which is intended to highlight and introduce some aspects of the various exemplary embodiments, but not to limit the scope of the invention. Detailed descriptions of a preferred exemplary embodiment adequate to allow those of ordinary skill in the art to make and use the inventive concepts will follow in the later sections.

In an aspect, an apparatus for reducing a harmonic response in an electronic circuit is provided. The apparatus includes an RF input configured to provide a first signal operating at a radio frequency. The apparatus also includes a local oscillator configured to produce a second signal operating at a local oscillator (LO) frequency. The apparatus also includes a switching mixer configured to mix the first and second signals. The apparatus also includes at least one notch filter that includes an inductor and a capacitor connected to the inductor in parallel. The notch filter is directly coupled to an input of the switching mixer in series. The notch filter is tuned such that its resonant frequency is a harmonic of the LO frequency signal.

In an aspect, the apparatus also includes a transformer configured to provide the first signal. In an aspect the apparatus also includes a second notch filter comprising a second inductor and a second capacitor connected to the second inductor in parallel. The second notch filter is directly coupled to an input of the switching mixer in series. The second notch filter is tuned such that its resonant frequency is a harmonic of the LO frequency signal. In an aspect, the transformer comprises a first winding and a second winding. Each terminal of the second winding is connected to an input of the first and second notch filters, respectively.

In an aspect, the transformer comprises a double-tuned transformer. In an aspect, inductors in the first and second notch filters have mutual coupling.

In an aspect, the apparatus also includes a plurality of N pairs of notch filters connected in series. Each of N notch filter pairs is tuned to a separate harmonic of the LO frequency signal. The switching mixer only receives the radio frequency signal as an output of the N notch filter pairs.

In an aspect, a method for reducing a harmonic response in an electronic circuit is provided. The method includes at least one notch filter providing a first signal operating at a radio frequency. The method also includes a switching mixer receiving a second signal operating at an LO frequency. The method also includes the switching mixer mixing the first and second signal.

It should be apparent that, in this manner, various exemplary embodiments enable an improved switching mixer. Particularly, by providing an embedded notch filter for a mixer in series, responses of a mixer at harmonics of a local oscillator frequency can be rejected with a reduced noise penalty.

BRIEF DESCRIPTION OF THE DRAWINGS

In order to better understand various exemplary embodiments, reference is made to the accompanying drawings wherein.

DETAILED DESCRIPTION

Figure 1:
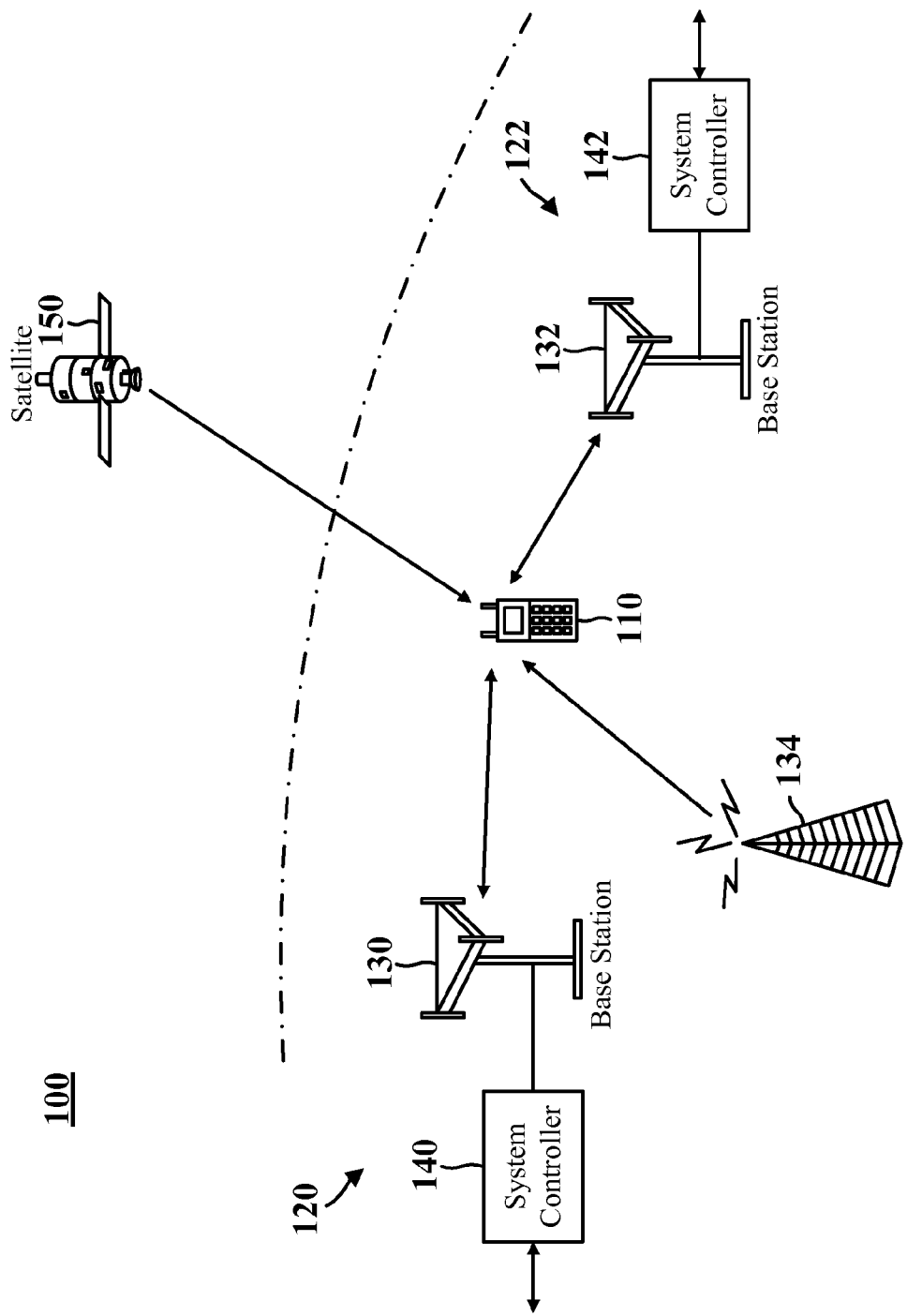
FIG. 1 illustrates a wireless device communicating with different wireless communications systems.

The detailed description set forth below in connection with the appended drawings is intended as a description of various exemplary embodiments of the present invention and is not intended to represent the only embodiments in which the present invention may be practiced. The detailed description includes specific details for the purpose of providing a thorough understanding of various concepts. However, it will be apparent to those skilled in the art that the present invention may be practiced without these specific details. In some instances, well-known structures and components are shown in block diagram form in order to avoid obscuring such concepts. Acronyms and other descriptive terminology may be used merely for convenience and clarity and are not intended to limit the scope of the invention. The term "exemplary" is used herein to mean "serving as an example, instance, or illustration." Any design described herein as "exemplary" is not necessarily to be construed as preferred or advantageous over other designs.

Several aspects of telecommunication systems will now be presented with reference to various apparatus and methods.

These apparatus and methods will be described in the following detailed description and illustrated in the accompanying drawings by various blocks, modules, components, circuits, steps, processes, algorithms, etc. (collectively referred to as "elements"). These elements may be implemented using electronic hardware, computer software, or any combination thereof. Whether such elements are implemented as hardware or software depends upon the particular application and design constraints imposed on the overall system.

By way of example, an element, or any portion of an element, or any combination of elements may be implemented with a "processing system" that includes one or more processors. Examples of processors include microprocessors, microcontrollers, digital signal processors (DSPs), field programmable gate arrays (FPGAs), programmable logic devices (PLDs), state machines, gated logic, discrete hardware circuits, and other suitable hardware configured to perform the various functionality described throughout this disclosure. One or more processors in the processing system may execute software. Software shall be construed broadly to mean instructions, instruction sets, code, code segments, program code, programs, subprograms, software modules, applications, software applications, software packages, routines, subroutines, objects, executables, threads of execution, procedures, functions, etc., whether referred to as software, firmware, middleware, microcode, hardware description language, or otherwise.

Accordingly, in one or more exemplary embodiments, the functions described may be implemented in hardware, software, firmware, or any combination thereof. If implemented in software, the functions may be stored on or encoded as one or more instructions or code on a computer-readable medium. Computer-readable media includes computer storage media. Storage media may be any available media that can be accessed by a computer. By way of example, and not limitation, such computer-readable media can comprise random-access memory (RAM), read-only memory (ROM), electronically erasable programmable ROM (EEPROM), compact disk (CD) ROM (CD-ROM), or other optical disk storage, magnetic disk storage or other magnetic storage devices, or any other medium that can be used to carry or store desired program code in the form of instructions or data structures and that can be accessed by a computer. Disk and disc, as used herein, includes CD, laser disc, optical disc, digital versatile disc (DVD), and floppy disk where disks usually reproduce data magnetically, while discs reproduce data optically with lasers. Combinations of the above should also be included within the scope of computer-readable media.

The word "exemplary" is used herein to mean serving as an example, instance, or illustration. Any embodiment described herein as "exemplary" is not necessarily to be construed as preferred or advantageous over other embodiments. Likewise, the term "embodiment" of an apparatus, circuit or method does not require that all embodiments of the invention include the described components, structure, features, functionality, processes, advantages, benefits, or modes of operation.

The terms "connected," "coupled," or any variant thereof, mean any connection or coupling, either direct or indirect, between two or more elements, and can encompass the presence of one or more intermediate elements between two elements that are "connected" or "coupled" together. The coupling or connection between the elements can be physical, logical, or a combination thereof. As used herein, two elements can be considered to be "connected" or "coupled" together by the use of one or more wires, cables and/or printed electrical connections, as well as by the use of electromagnetic energy, such as electromagnetic energy having wavelengths in the radio frequency region, the microwave region and the optical (both visible and invisible) region, as several non-limiting and non-exhaustive examples.

Any reference to an element herein using a designation such as "first," "second," and so forth does not generally limit the quantity or order of those elements. Rather, these designations are used herein as a convenient method of distinguishing between two or more elements or instances of an element. Thus, a reference to first and second elements does not mean that only two elements can be employed, or that the first element must precede the second element.

As used herein, the terms "comprises", "comprising,", "includes" and/or "including", when used herein, specify the presence of the stated features, integers, steps, operations, elements, and/or components, but do not preclude the presence or addition of one or more other features, integers, steps, operations, elements, components, and/or groups thereof.

Various aspects of circuits for a harmonic rejection circuit for a switching mixer will now be presented. However, as those skilled in the art will readily appreciate, such aspects may be extended to other circuit configurations and devices. Accordingly, all references to a specific application for mixer arrangements, or any component, structure, feature, functionality, or process within a synchronized wireless device are intended only to illustrate exemplary aspects of electronic hardware with the understanding that such aspects may have a wide differential of applications.

Various embodiments of hardware with a double-tuned transformer with a notch filter may be used, such as a mobile phone, personal digital assistant (PDA), desktop computer, laptop computer, palm-sized computer, tablet computer, set-top box, navigation device, work station, game console, media player, or any other suitable device.

FIG. 1 illustrates a wireless device communicating with different wireless communications systems. FIG. 1 is a diagram 100 illustrating a wireless device 110 communicating with different wireless communication systems 120, 122. Wireless device 110 can use a switching mixer, for example, for communications via carrier waves at specified frequencies via techniques like phase modulation; other uses of mixers in electronic hardware are known to those of skill in the art.

Wireless systems 120, 122 may each be a Code Division Multiple Access (CDMA) system, a Global System for Mobile Communications (GSM) system, a Long Term Evolution (LTE) system, a wireless local area network (WLAN) system, or some other wireless system. A CDMA system may implement Wideband CDMA (WCDMA), CDMA 1× or cdma2000, Time Division Synchronous Code Division Multiple Access (TD-SCDMA), or some other version of CDMA. TD-SCDMA is also referred to as Universal Terrestrial Radio Access (UTRA) Time Division Duplex (TDD) 1.28 Mcps Option or Low Chip Rate (LCR). LTE supports both frequency division duplexing (FDD) and time division duplexing (TDD). For example, wireless system 120 may be a GSM system, and the wireless system 122 may be a WCDMA system. As another example, the wireless system 120 may be an LTE system, and wireless system 122 may be a CDMA system.

For simplicity, diagram 100 shows wireless system 120 including one base station 130 and one system controller 140, and wireless system 122 including one base station 132 and one system controller 142. In general, each wireless system 120, 122 may include any number of base stations and any set of network entities. Each base station 130, 132 may support communication for wireless devices within the coverage of the base station. Base stations 130, 132 may also be referred to as a Node B, an evolved Node B (eNB), an access point, a base transceiver station, a radio base station, a radio transceiver, a transceiver function, a basic service set (BSS), an extended service set (ESS), or some other suitable terminology. Wireless device 110 may also be referred to as a user equipment (UE), a mobile device, a remote device, a wireless device, a wireless communications device, a station, a mobile station, a subscriber station, a mobile subscriber station, a terminal, a mobile terminal, a remote terminal, a wireless terminal, an access terminal, a client, a mobile client, a mobile unit, a subscriber unit, a wireless unit, a remote unit, a handset, a user agent, or some other suitable terminology. Wireless device 110 may be a cellular phone, a smartphone, a tablet, a wireless modem, a personal digital assistant (PDA), a handheld device, a laptop computer, a smartbook, a netbook, a cordless phone, a wireless local loop (WLL) station, or some other similar functioning device.

Wireless device 110 may be capable of communicating with wireless system 120 and/or 122. Wireless device 110 may also be capable of receiving signals from broadcast stations, such as broadcast station 134. Wireless device 110 may also be capable of receiving signals from satellites, such as satellite 150, in one or more global navigation satellite systems (GNSS). Wireless device 110 may support one or more radio technologies for wireless communication such as GSM, WCDMA, cdma2000, LTE, 802.11, etc. The terms "radio technology," "radio access technology," "air interface," and "standard" may be used interchangeably.

Wireless device 110 may communicate with a base station in a wireless system via the downlink and the uplink. The downlink (or forward link) refers to the communication link from the base station to the wireless device, and the uplink (or reverse link) refers to the communication link from the wireless device to the base station. A wireless system may utilize TDD and/or FDD. For TDD, the downlink and the uplink may share the same frequency, and downlink transmissions and uplink transmissions may be sent on the same frequency in different time periods. For FDD, the downlink and the uplink are allocated separate frequencies. Downlink transmissions may be sent on one frequency, and uplink transmissions may be sent on another frequency. Some exemplary radio technologies supporting TDD include GSM, LTE, and TD-SCDMA. Some exemplary radio technologies supporting FDD include WCDMA, cdma2000, and LTE.

Figure 2:
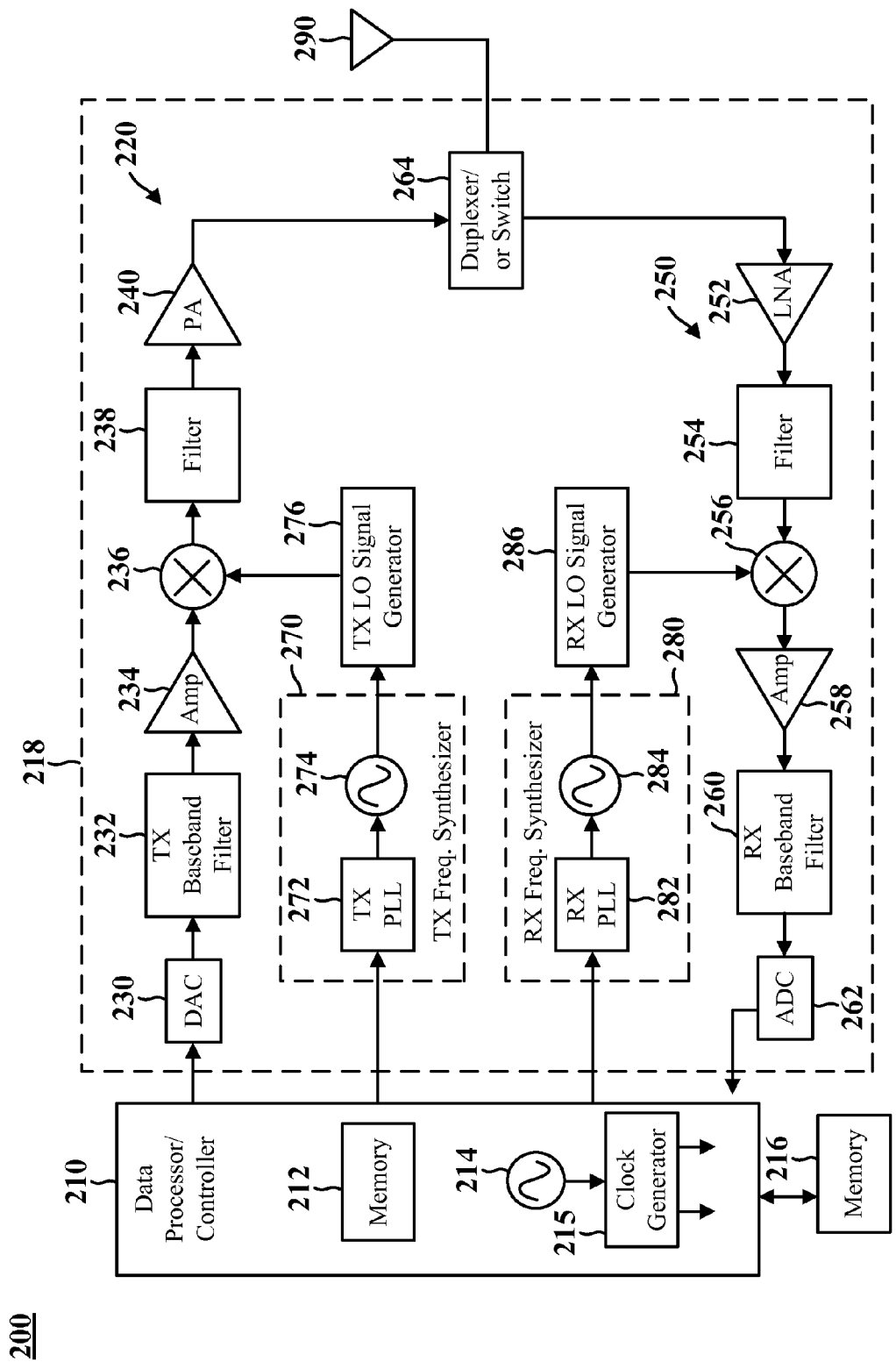
FIG. 2 illustrates an exemplary wireless transceiver.

FIG. 2 is a block diagram 200 of an exemplary wireless device, such as wireless device 110. Wireless device 200 includes a data processor/controller 210, a transceiver 218, and an antenna 290. The data processor/controller 210 may be referred to as a processing system. A processing system may include data processor/controller 210 or both data processor/controller 210 and memory 216.

Transceiver 218 includes a transmitter (TX) chain 220 and a receiver (RX) chain 250 that support bi-directional communication. TX chain 220 and/or RX chain 250 may be implemented with a super-heterodyne architecture or a direct-conversion architecture. In the super-heterodyne architecture, a signal is frequency converted between RF and baseband in multiple stages, e.g., from RF to an intermediate frequency (IF) in one stage, and then from IF to baseband in another stage for a receiver. In the direct-conversion architecture, which is also referred to as a zero-IF architecture, a signal is frequency converted between RF and baseband in one stage. The super-heterodyne and direct-conversion architectures may use different circuit blocks and/or have different requirements. In the exemplary design shown in FIG. 2, the transmitter chain 220 and the receiver chain 250 are implemented with the direct-conversion architecture.

In the transmit chain, data processor/controller 210 may process (e.g., encode and modulate) data to be transmitted and provide the data to a digital-to-analog converter (DAC) 230. DAC 230 converts a digital input signal to an analog output signal. The analog output signal is provided to a transmit (TX) baseband (low-pass) filter 232, which may filter the analog output signal to remove images caused by the prior digital-to-analog conversion by DAC 230. An amplifier (amp) 234 may amplify the signal from TX baseband filter 232 and provide an amplified baseband signal. An up-converter (mixer) 236 may receive the amplified baseband signal and a TX LO signal from a TX LO signal generator 276. The up-converter 236 may up-convert the amplified baseband signal with the TX LO signal and may provide an up-converted signal. A filter 238 may filter the up-converted signal to remove images caused by the frequency up-conversion. A power amplifier (PA) 240 may amplify the filtered RF signal from filter 238 to obtain the desired output power level and provide an output RF signal. The output RF signal may be routed through a duplexer/switchplexer 264.

For FDD, transmitter chain 220 and receiver chain 250 may be coupled to duplexer 264, which may include a TX filter for transmitter chain 220 and an RX filter for receiver chain 250. The TX filter may filter the output RF signal to pass signal components in a transmit band and attenuate signal components outside the transmit band. For TDD, transmitter chain 220 and receiver chain 250 may be coupled to switchplexer 264. Switchplexer 264 may pass the output RF signal from the transmitter chain 220 to the antenna 290 during uplink time intervals. For both FDD and TDD, the duplexer/switchplexer 264 may provide the output RF signal to the antenna 290 for transmission via a wireless channel.

In the receive chain, the antenna 290 may receive signals transmitted by base stations and/or other transmitter stations and may provide a received RF signal. The received RF signal may be routed through duplexer/switchplexer 264. For FDD, the RX filter within the duplexer 264 may filter the received RF signal to pass signal components in a receive band and attenuate signal components outside the receive band. For TDD, the switchplexer 264 may pass the received RF signal from the antenna 290 to the receiver chain 250 during downlink time intervals. For both FDD and TDD, the duplexer/switchplexer 264 may provide the received RF signal to the receiver chain 250.

Within the receiver chain 250, the received RF signal may be amplified by a low noise amplifier (LNA) 252 and filtered by a filter 254 to obtain an input RF signal. A down-converter (mixer) 256 may receive the input RF signal and an RX LO signal from an RX LO signal generator 286. The down-converter 256 may down-convert the input RF signal with the RX LO signal and provide a down-converted signal. The down-converted signal may be amplified by an amplifier 258 and further filtered by an RX baseband (low-pass) filter 260 to obtain an analog input signal. The analog input signal is provided to an analog-to-digital converter (ADC) 262. The ADC 262 converts an analog input signal to a digital output signal. The digital output signal is provided to the data processor/controller 210.

A TX frequency synthesizer 270 may include a TX phase locked loop (PLL) 272 and a VCO 274. VCO 274 may generate a TX VCO signal at a desired frequency. TX PLL 272 may receive timing information from the data processor/controller 210 and generate a control signal for VCO 274. The control signal may adjust the frequency and/or the phase of VCO 274 to obtain the desired frequency for the TX VCO signal. TX frequency synthesizer 270 provides the TX VCO signal to TX LO signal generator 276. TX LO signal generator 276 may generate a TX LO signal based on the TX VCO signal received from TX frequency synthesizer 270.

A RX frequency synthesizer 280 may include an RX PLL 282 and a VCO 284. VCO 284 may generate an RX VCO signal at a desired frequency. RX PLL 282 may receive timing information from the data processor/controller 210 and generate a control signal for VCO 284. The control signal may adjust the frequency and/or the phase of VCO 284 to obtain the desired frequency for the RX VCO signal. RX frequency synthesizer 280 provides the RX VCO signal to RX LO signal generator 286. The RX LO signal generator may generate an RX LO signal based on the RX VCO signal received from RX frequency synthesizer 280.

LO signal generators 276, 286 may each include frequency dividers, buffers, etc. LO signal generators 276, 286 may be referred to as frequency dividers if they divide a frequency provided by TX frequency synthesizer 270 and RX frequency synthesizer 280, respectively. PLLs 272, 282 may each include a phase/frequency detector (PFD), a filter (e.g., a loop filter), a charge pump, a frequency divider, etc. Each VCO signal and each LO signal may be a periodic signal with a particular fundamental frequency. The TX LO signal and the RX LO signal from LO generators 276, 286 may have the same frequency for TDD or different frequencies for FDD. The TX VCO signal and the RX VCO signal from VCOs 274, 284 may have the same frequency (e.g., for TDD) or different frequencies (e.g., for FDD or TDD).

The conditioning of the signals in transmitter chain 220 and receiver chain 250 may be performed by one or more stages of amplifier, filter, up-converter, down-converter, etc. These circuits may be arranged differently from the configuration shown in FIG. 2. Furthermore, other circuits not shown in FIG. 2 may also be used to condition the signals in transmitter chain 220 and receiver chain 250. For example, impedance matching circuits may be located at the output of PA 240, at the input of LNA 252, between antenna 290 and duplexer/switchplexer 264, etc. Some circuits in FIG. 2 may also be omitted. For example, filter 238 and/or filter 254 may be omitted. All or a portion of transceiver 218 may be implemented on one or more analog integrated circuits (ICs), RF ICs (RFICs), mixed-signal ICs, etc. For example, TX baseband filter 232 to PA 240 in transmitter chain 220, LNA 252 to RX baseband filter 260 in receiver chain 250, PLLs 272, 282, VCOs 274, 284, and LO signal generators 276, 286 may be implemented on an RFIC. PA 240 and possibly other circuits may also be implemented on a separate IC or a circuit module.

Data processor/controller 210 may perform various functions for the wireless device. For example, data processor/controller 210 may perform processing for data being transmitted via transmitter chain 220 and received via receiver chain 250. Data processor/controller 210 may control the operation of various circuits within transmitter chain 220 and receiver chain 250. Memory 212 and/or memory 216 may store program codes and data for data processor/controller 210. The memory may be internal to data processor/controller 210 (e.g., memory 212) or external to data processor/controller 210 (e.g., memory 216). The memory may be referred to as a computer-readable medium. An oscillator 214 may generate a VCO signal at a particular frequency. A clock generator 215 may receive the VCO signal from oscillator 214 and may generate clock signals for various modules within data processor/controller 210. Data processor/controller 210 may be implemented on one or more application specific integrated circuits (ASICs) and/or other ICs.

Figure 3:
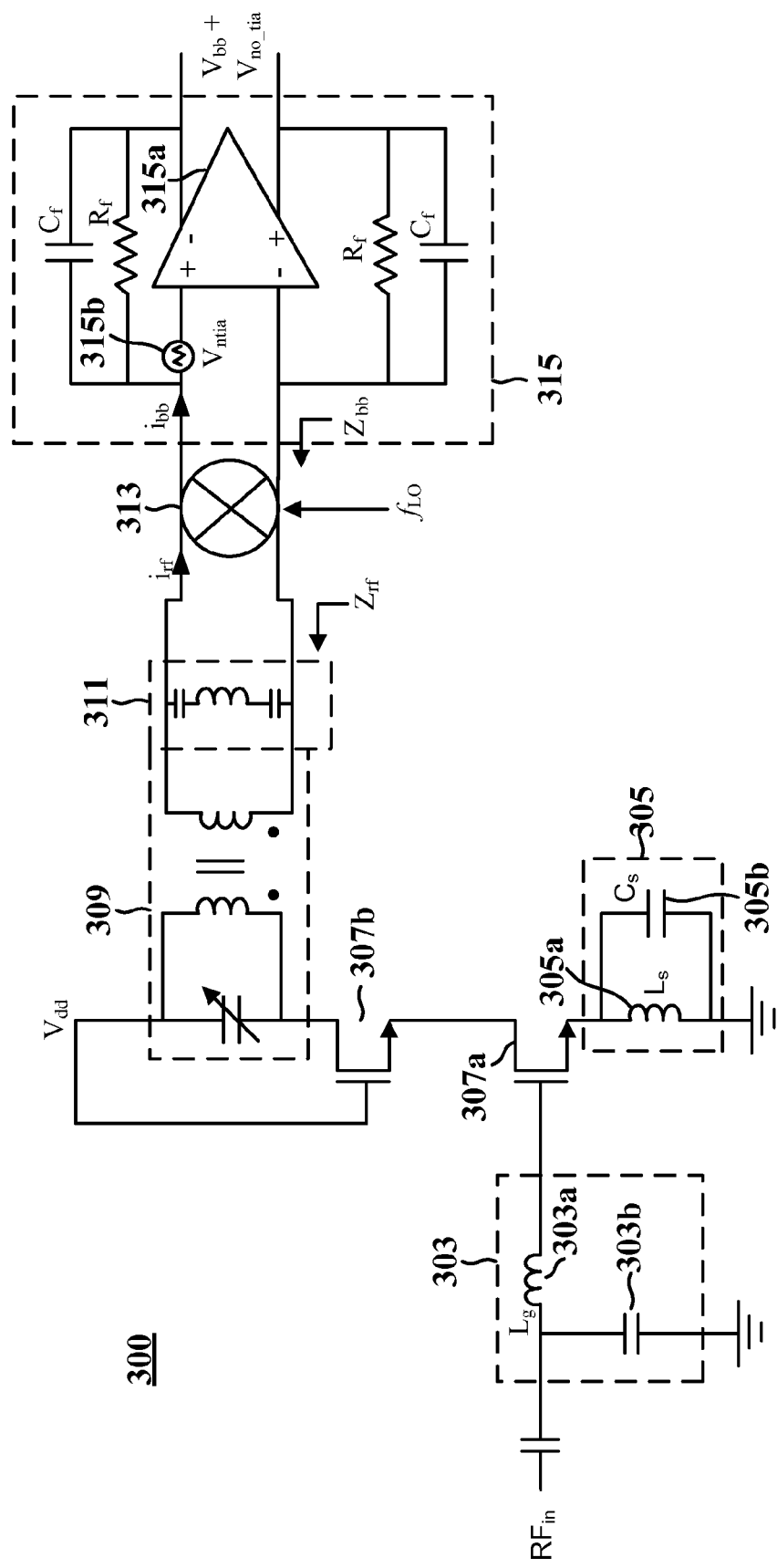
FIG. 3 illustrates an exemplary stage of a wireless receiver front-end, including a switching mixer.

FIG. 3 illustrates an exemplary stage of a wireless receiver front-end, including a switching mixer. Circuit 300 includes a low-noise amplifier comprising an LC matching circuit 303, an LC trapping circuit 305 and amplifying devices 307a-307b, transformer 309, notch filter 311, harmonic reject mixer 313 and trans-impedance amplifier (TIA) 315. Circuit 300 can be implemented, for example, as multiple components of RX chain 250 for wireless receiver 200. In some embodiments, circuit 300 is configured to be implemented as multiple components in RX chain (e.g., LNA 252, filter 254, and mixer 256). The illustrative embodiment of circuit 300 includes multiple rejection features that can be used independently or in tandem to reject undesired signals at one or more harmonics of the local oscillator frequency, such as LO frequency signal produced by RX LO signal generator 286.

The Low-Noise Amplifier (LNA) can comprise, for example, LC matching circuit 303, LC trapping circuit 305 and amplifying devices 307a-307b. In some embodiments, the LNA can comprise other elements of the circuit. In the illustrative embodiment, for example, the LNA can be a cascode amplifier that provides an output current to transformer 309. The cascode configuration can, for example, provide improved isolation between the input and output port of the LNA and can improve, for example, gain and stability for the circuit.

LC matching circuit 303 can include an L-section of an impedance matching circuit, which can include a shunt-connected capacitor 303b and a series-connected inductor 303a. The output of inductor 303a can be connected to the input of amplifying devices 307a-307b. During operation, capacitor 303b provides a low impedance to ground; the impedance to ground decreases as the frequency of the signal increases. Conversely, inductor 303a has an increased impedance as the frequency increases. The inductor-capacitor combination 303a-303b can suppress specific undesired high-frequency signals, such as signals with frequencies falling at harmonics of the LO frequency. In some embodiments, multiple LC matching sections can be placed in a cascade; this can increase rejection of high frequencies at this stage of the circuit.

In some embodiments, traps, such as a parallel and/or series traps, can be used to reject one or more specified frequencies. A person of ordinary skill would be aware of inclusion of such traps before the input of amplifying devices 307a-307b. The addition of suppression components, such as LC matching circuit 303, or combinations of matching circuits and/or traps, can be weighed against factors like cost, printed circuit board (PCB) area, and noise performance degradation that is associated with use of the suppression components.

LC trapping circuit 305 can include a source degeneration inductor (Ls) 305a and a source degeneration capacitor ($C_S$) 305b. In some embodiments, only source degeneration inductor 305a is included in the circuit. Source degeneration capacitor 305b can be added to resonate at a harmonic of the local oscillator frequency and suppress the gain of the LNA at that specific LO harmonic frequency. The addition of source degeneration capacitor 305b can be weighed against overall stability of the LNA.

Amplifying devices 307a-307b can be transistors, such as metal-oxide-semiconductor field-effect transistors (MOSFETs) or other components that amplify a signal received at the input of 307a by drawing an output current from supply voltage $V_{dd}$ through the primary winding of transformer 309. The configuration of amplifying devices 307a-307b can be arranged, for example, to reduce Miller capacitance and increase the bandwidth of the LNA.

Transformer 309 can be a transformer that outputs a current in its secondary winding that is based on the current at its primary winding. In the illustrative embodiment, for example, transformer 309 is a single-tuned transformer that includes a tunable capacitor at its primary winding. In some embodiments, the capacitor can be another component that provides an adjustable capacitance, such as a varactor. In some embodiments, the secondary winding is connected in parallel with notch filter 311.

Notch filter 311 can, for example, act as a trap resonating at a harmonic of the local oscillator frequency to shunt the secondary winding of transformer 309. Notch filter 311 can provide rejection at the configured resonant frequency. In some embodiments, notch filter 311 can be added to provide a resonating trap at a designated harmonic. The amount of rejection provided by notch filter 311 can be dependent on the ratio between the input impedance of mixer 313 and the trap impedance at the designated harmonic frequency. In some embodiments, such as where mixer 313 is a passive switching mixer, for example, the noise contributed by the trans-impedance operational amplifier ($V_{ntia}$ 315b) to the output can generally be proportional to the rejection provided by notch filter 311.

Mixer 313 can mix the amplified radio frequency signal received from the output of the secondary winding of transformer 309 and a local oscillator frequency signal to produce an output signal. In some embodiments, mixer 313 produces a baseband signal current ($i_{bb}$) as the output signal. In some embodiments, mixer 313 can comprise an IQ mixer that produces separate in-phase (I) and quadrature-phase (Q) signals. In some embodiments, mixer 313 can comprise a harmonic rejection mixer that suppresses the harmonic response that would be produced when employing a switching mixer. In such embodiments, harmonic rejection mixer 313 can receive a multi-phase local oscillator signal in lieu of a single-phase LO signal. Generation of a multi-phase local oscillator signal can require more physical space on a circuit chip and can consume more current than the generation of a corresponding single-phase local oscillator signal. Use of the multi-phase signal can be weighed against factors like cost and power consumption. In some embodiments, harmonic rejection mixer 313 can comprise an active mixer.

Trans-impedance operational amplifier (TIA) 315 includes an operational amplifier 315a, resistors $R_f$ and capacitors $C_f$. TIA 315 can convert an input baseband current received from mixer 313 to produce an output voltage based on the input current. In the illustrative embodiment, for example, TIA 315 can convert the input baseband current $i_{bb}$ into baseband voltage $V_{bb}$. During operation, operational amplifier 315a can contribute noise to the output baseband voltage $V_{bb}$. The noise generated by operational amplifier 315a can be represented by input noise voltage source $V_{ntia}$ 315b. $V_{ntia}$ 315b can be amplified and appear at TIA 315 output ($V_{no\_tia}$) according to a ratio between the impedance of the feedback components $R_f$ and $C_f$ ($Z_f=1/(1/Z_{Rf}+1/Z_{Cf})$) and the baseband impedance $Z_{bb}$ looking back to the output of mixer 313. The impedance of feedback components comprising of $R_f$ and $C_f$ can be characterized as:

$$Z_f = \frac{1}{\frac{1}{Z_{rf}} + \frac{1}{Z_{cf}}}$$

In the illustrative embodiment, where mixer 313 is a mixer, the baseband impedance $Z_{bb}$ is proportional to RF impedance $Z_{rf}$ presented to mixer 313 input at LO fundamental and harmonic frequencies. Thus, if:

$$V_{no\_tia}^2 \propto \left|1 + \frac{Z_f}{Z_{bb}}\right|^2$$

The TIA noise contribution is proportional to the reduced harmonic response if notch filter 311 is used in combination with mixer 313. The harmonic response rejection has to be chosen such that TIA noise contribution to baseband output does not grow too large.

Depending on potential tradeoffs related to issues like physical area and noise, circuit 300 can include one or more components, such as LC matching circuit 303, LC trapping circuit 305, notch filter 311, and/or harmonic reject mixer 313 to reject undesired interference that are harmonics of the LO frequency.

Figure 4:
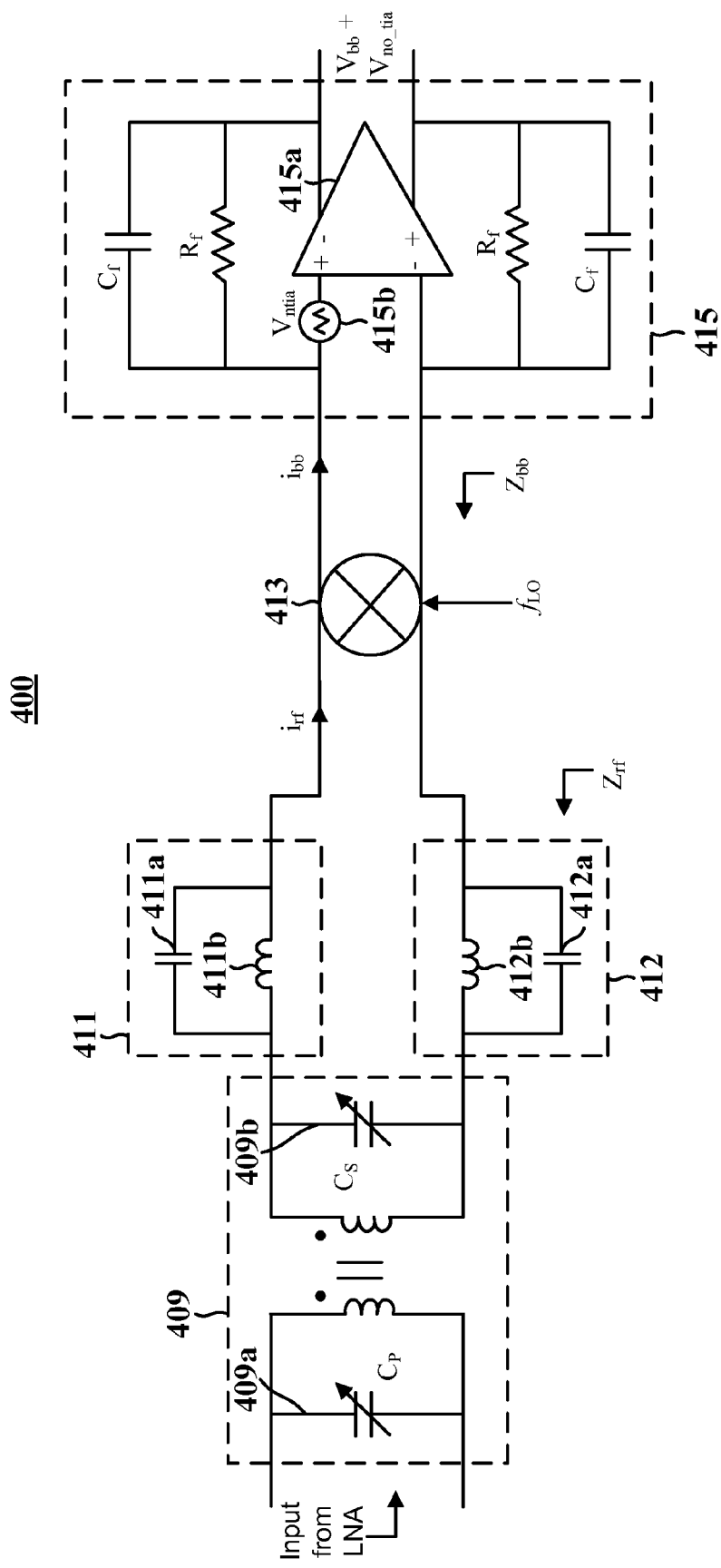
FIG. 4 illustrates another exemplary stage of a wireless receiver front-end, including a switching mixer.

FIG. 4 illustrates another exemplary stage of a wireless receiving front-end, including a switching mixer 413. Circuit 400 can receive an input signal from a LNA, such as the LNA in circuit 300, and produce an output baseband voltage ($V_{bb}$). Circuit 400 includes a transformer 409, notch filters 411-412, switching mixer 413, and TIA 415. Circuit 400 is similar to circuit 300 and can be configured to be implemented as multiple components included in RX chain 250.

Transformer 409 can include a primary winding and a secondary winding. In some embodiments, transformer 409 can be a single-tuned or double-tuned transformer. When transformer 409 is tuned, it includes a tunable passive element, such as a tunable capacitor or varactor. The inductive reactance of transformer 409 can be tuned out, with the tunable capacitor providing a shunt capacitance at the resonant frequency. In the illustrative embodiment, for example, transformer 409 is a double-tuned transformer that includes a first tunable capacitor ($C_P$) 409a and a second tunable capacitor ($C_S$) 409b.

Transformer 409 can have a coupling co-efficient (k) between the primary and secondary windings. In the illustrative embodiment, for example, transformer 409 can have a relatively loose coupling co-efficient (e.g., 0.6≤k≤0.65). The loose coupling can allow transformer 409 to be double-tuned at the primary winding by $C_P$ 409a and the secondary winding by $C_s$ 409b, respectively. The double tuning can produce an improved harmonic response rejection by giving better selectivity to reject out-of-band harmonics, as well as greater control over the in-band frequency response and output impedance of the LNA of FIG. 3 ($Z_{rf}$).

In some embodiments, transformer 409 can produce a differential signal, with the secondary winding sending the signals to notch filters 411 and 412, respectively. Notch filters 411-412 can be tunable LC traps (i.e., tank circuits) that are tuned to have their resonant frequency equal that of a harmonic of the LO frequency. Traps 411-412 can be placed between transformer 409 and switching mixer 413 to suppress inputs to switching mixer 413 that fall at a harmonic of the LO frequency. Trap 411 can include a tunable capacitor 411a and inductor 411b, while trap 412 can include tunable capacitor 412a and inductor 412b. Traps 411-412 can be in series and can each receive a component of the differential signal produced by the secondary winding of transformer 409. In some embodiments, each of traps 411-412 can be tuned to have their resonant frequency fall at a harmonic of the LO frequency. In such instances, traps 411-412 may each be tuned to the same harmonic frequency. In some embodiments, tunable capacitors 411a, 412a can be tuned to resonate at a different harmonic frequency. In some embodiments, capacitors 411a, 412a can be tuned based on changes to the LO frequency. In some embodiments, inductors 411b, 412b can have mutual coupling. The mutual coupling between inductors 411b, 412b can broaden the notch bandwidth and can therefore increase the Q factor and reduce physical area associated with traps 411-412.

In the illustrative embodiment, for example, traps 411-412 can each be tuned to have their resonant frequency fall at the third harmonic of the LO frequency ($3*f_{LO}$). As traps 411-412 are tuned to have their resonant frequencies at the third harmonic, each trap 411-412 provides high impedance for input at the third harmonic frequency as seen by switching mixer 413 such that the input current ($i_{rf}$) is suppressed at the input of switching mixer 413 at the third harmonic frequency. As will be discussed in further detail in relation to FIG. 5, circuit 400 can include a passive network comprising a plurality of notch filter pairs, where each pair is tuned such that each tank pair 411-412 independently suppresses different harmonic frequencies.

Switching mixer 413 can be a mixer that produces a current based on an input current received from the transformer 409. The output current produced by switching mixer 413 can be based on an input radio frequency signal ($i_{rf}$) and an input local oscillator frequency ($f_{LO}$). Switching mixer 413 can be implemented as an IQ mixer that produces separate I (in-phase) and Q (quadrature-phase) signals. In some embodiments, the LO frequency can have a specified duty cycle, such as a 25% duty cycle. In some embodiments, switching mixer 413 can receive a second input current that is based on the local oscillator frequency ($f_{LO}$) and produces the output signal based on the input radio frequency current and the input local oscillator current.

In some embodiments, switching mixer 413 can be a passive mixer. In some embodiments, switching mixer 413 can be a balanced mixer, such as, for example, a single-balanced mixer or a double-balanced mixer. The balanced mixer can be configured such that even harmonic responses are greatly reduced. In the illustrative embodiment, for example, switching mixer 413 can be a double-balanced mixer that receives a differential input signal from transformer 409 and produces a differential output signal for TIA 415. In some embodiments, switching mixer 413 can be a single-balanced mixer that receives the single-ended input signal from transformer 409 or the LNA directly and produces a differential output signal for TIA 415.

Switching mixer 413 can produce a baseband signal current ($i_{bb}$) that is based on a combination of the radio frequency current and the local oscillator signal. For example, when used as part of an RX chain 250, switching mixer 413 can down-convert input signals to produce an output baseband current that has an output frequency equal to that of the difference between the input radio frequency and the LO frequency (i.e., $f_{bb}=|f_{rf}-f_{LO}|$).

When the switching mixer 413 down-converts the input signal, frequencies at harmonics of the LO frequency at the input can also be folded into the output signal (this process is conventionally known as "noise folding"). In some embodiments, the configuration of traps 411-412 to suppress harmonic currents can lower the effects of noise folding, as the magnitude of harmonic currents folded into the output current are lowered. In some embodiments, additional traps 411-412 are included in circuit 400 to suppress frequencies falling at other harmonics; this can reduce the noise folding effects for the other harmonic frequencies.

Trans-impedance amplifier (TIA) 415 can include an operational amplifier 415a and tuning component pairs $R_f$ and $C_f$. TIA 415 is similar to TIA 315 and can convert an input baseband signal current to produce an output signal voltage. In some embodiments, the output signal voltage comprises a differential signal.

In some instances op-amp 415a can contribute noise to the output voltage $V_{bb}$. The noise generated by operational amplifier 415a can be represented by voltage source $V_{ntia}$ 415b. As discussed above in relation to $V_{ntia}$ 315b, the magnitude of the noise is proportional to the ratio of the feedback impedance of TIA 415 and the baseband impedance ($Z_f/Z_{bb}$). When switching mixer 413 comprises a passive mixer, the baseband current $i_{bb}$ (and the associated baseband impedance $Z_{bb}$) is a result of the down-conversion of all RF currents at harmonics of the LO frequency ($f_{LO}$, $2*f_{LO}$, $3*f_{LO}$, etc.) by switching mixer 413. The implementation of traps 411-412 can increase the total baseband impedance, as the impedance $Z_{rf}$ at the specified harmonic frequency is increased due to resonance of tanks 411-412 at that frequency. In the illustrative embodiment for example, the magnitude of baseband impedance increases when traps 411-412 are tuned to resonate at the third harmonic of the LO frequency. The increase in total baseband impedance reduces the TIA output noise $V_{no\_tia}$ contributed by $V_{ntia}$ 415b.

In some embodiments, circuit 400 can include a loosely-coupled, double-tuned transformer 409 in conjunction with series-connected, series harmonic-resonant traps 411-412, which can improve rejection of local oscillator harmonics frequencies. In some embodiments, the harmonic rejection is greater than that of the series notch filter 311 of circuit 300.

Figure 5:
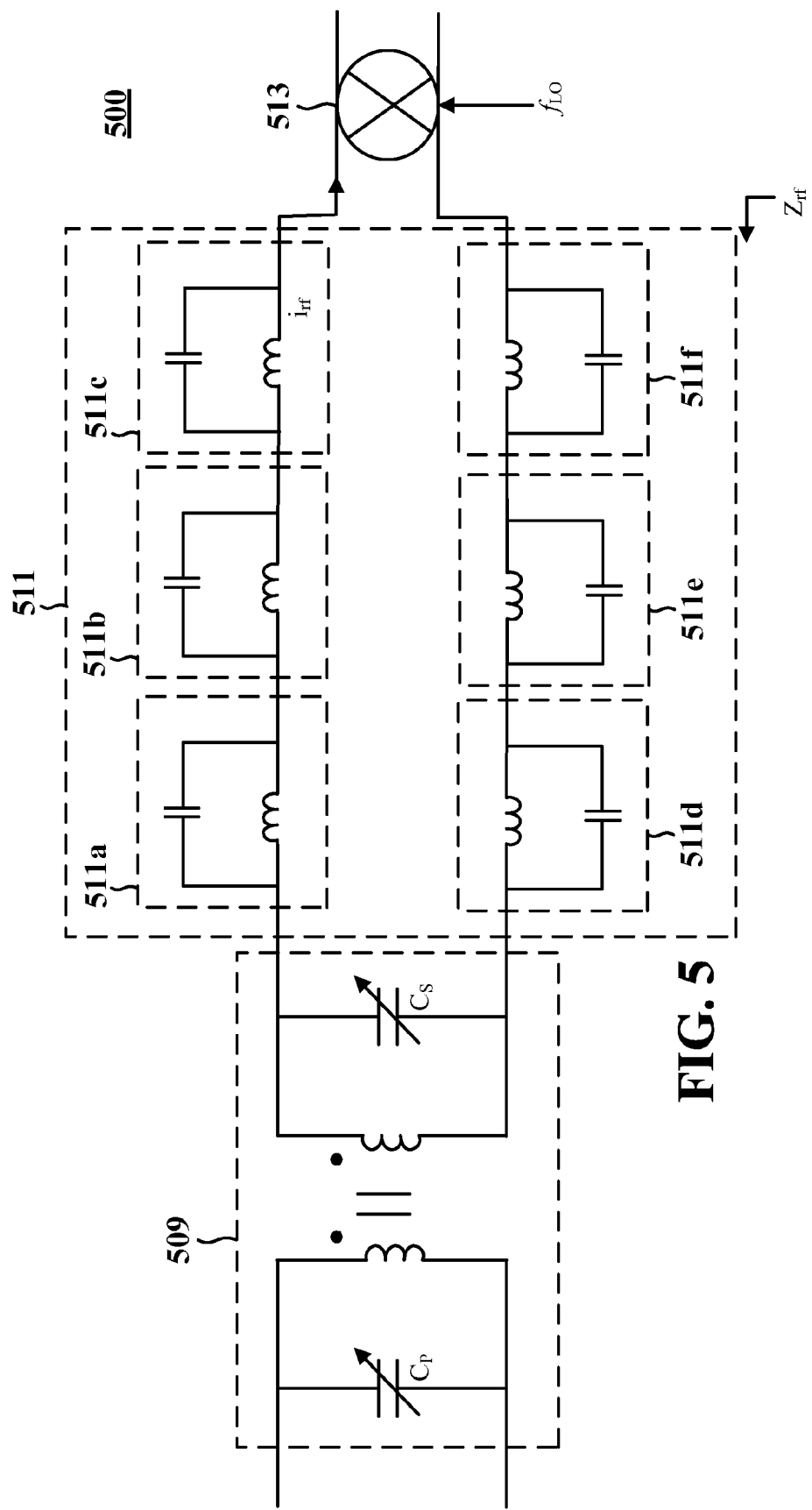
FIG. 5 illustrates an exemplary stage of a wireless receiver that includes a passive network.

FIG. 5 illustrates an exemplary stage of a wireless receiver that includes a passive network for harmonic rejection. Circuit 500 is similar to circuit 400 and includes transformer 509, passive network 511 (including traps 511a-511f), and switching mixer 513.

As discussed above in relation to traps 411-412 in FIG. 4, circuit 500 can include passive network 511 placed between the output of transformer 509 and the input of switching mixer 513 to suppress one or more frequencies that fall at harmonics of the LO frequency. In some embodiments, switching mixer 513 can be balanced and can suppress frequencies falling at even harmonics of the LO frequency (i.e., $2*N*f_{LO}$, where N=1, 2, 3, etc.).

In such instances, passive network 511 can include one or more series pairs of harmonic frequency traps 511a-511f, with each pair tuned to suppress frequencies at odd harmonics of the LO frequency (e.g., $3*f_{LO}$, $5*f_{LO}$, $7*f_{LO}$, etc.). Each pair of series traps 511a-511f can be tuned such that their resonant frequency is a frequency that falls at a harmonic of the LO frequency. When connected in series, the cascade configuration of traps can allow each trap pair 511a-511f to suppress a specified frequency while allowing other frequencies to pass through without significant suppression. Passive network 511 can be configured to suppress multiple harmonic frequencies to improve harmonic frequency rejection and reduce the noise component of an output signal from mixer 513 and a TIA after it.

Figure 6:
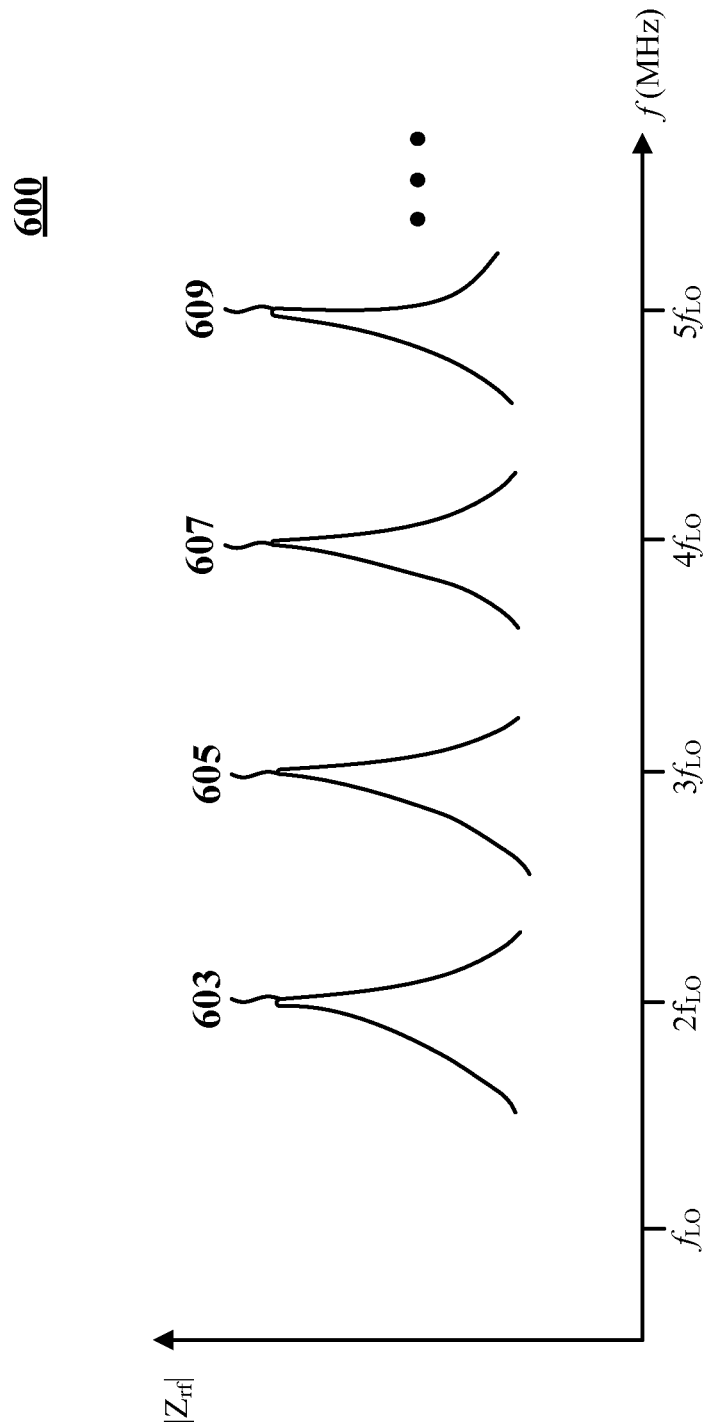
FIG. 6 illustrates an exemplary impedance graph of an exemplary passive network.

FIG. 6 illustrates an exemplary impedance graph for an exemplary passive network 511. Impedance graph 600 can correspond to the relative impedance seen by the radio frequency current $i_{rf}$ at specific frequencies when traversing through passive network 511.

Graph 600 can correspond to a configuration of circuit 400, 500 that includes a cascade of series harmonic frequency trap pairs 411-412, 511a-511f that are tuned to have resonant frequencies falling at multiple harmonics of the LO frequency. In some embodiments, multiple series harmonic trap pairs 511a-511f can be included in passive network 511, one trap pair for each of N harmonics above the fundamental frequency. In some embodiments, mixer 413, 513 can be a balanced mixer and suppresses even harmonic responses; in such instances, passive network 511 can include only series harmonic trap pairs 511a-511f for each odd harmonic frequency above the fundamental frequency.

As seen by peaks 603-609, the magnitude of the RF impedance ($|Z_{rf}|$) is greatest at frequencies falling at the harmonics of the LO frequency. In the illustrative embodiment, for example, mixer 413 can be a passive mixer; the increase of $|Z_{rf}|$ can increase the output baseband frequency $Z_{bb}$ and can reduce the noise component of an output baseband voltage $V_{bb}$ produced by the TIA 415.

Figure 7:
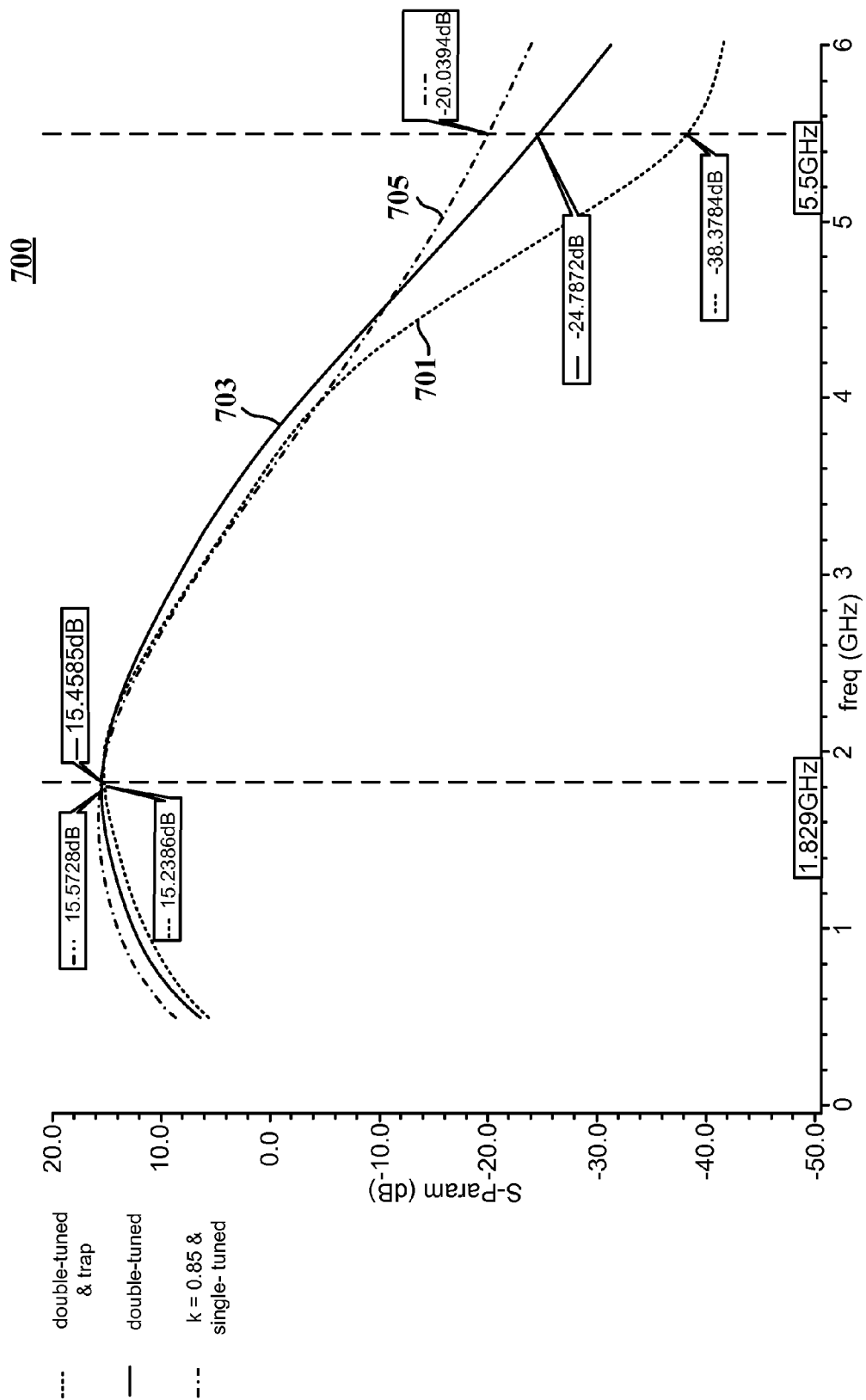
FIG. 7 illustrates exemplary responses for various transformer configurations.

FIG. 7 illustrates exemplary responses for various configurations. Graph 700 illustrates S-Parameter frequency responses (here, $S_{21}$) for different configurations of circuit 400 including an LNA. Response 701 illustrates a response for a configuration including a double-tuned transformer 409 and trap pairs 411-412. Response 703 illustrates a response for a configuration including a double-tuned transformer 409, but excluding trap pairs 411-412. Response 705 includes a response for a configuration including a single-tuned transformer 409 that has a high coupling coefficient (k=0.85) while excluding traps 411-412.

As discussed in relation to transformer 409, the response of the tank circuit formed by the primary and secondary winding of transformer 409 with the specified capacitance will be at least partially based on the coupling co-efficient of the transformer. A strong coupling (i.e., high coupling co-efficient: 0.8≤k≤0.95) can push one of the resonances to a high frequency, broadening the bandwidth. In contrast, a weaker coupling (i.e., lower coupling co-efficient: 0.6≤k≤0.7) can result in better harmonic frequency rejection.

Graph 700 illustrates the $S_{21}$ frequency responses for specific configurations of transformer 409 and trap pairs 411-412. As shown by responses 701-705, while the S-Parameter response is virtually identical at the first harmonic frequency ($f_{LO}$=1.829 GHz), the amount of attenuation greatly differs at the third harmonic frequency. While a single-tuned transformer (response 705) only results in 20 dB of attenuation (35.5 dB of rejection), a configuration that includes a double-tuned transformer provides 24.8 dB (40.3 dB of rejection) of attenuation (response 703) and a configuration that includes a double-tuned transformer and a harmonic trap pair for $3*f_{LO}$ provides over 38 dB of attenuation (53.5 dB of rejection).

Figure 8:
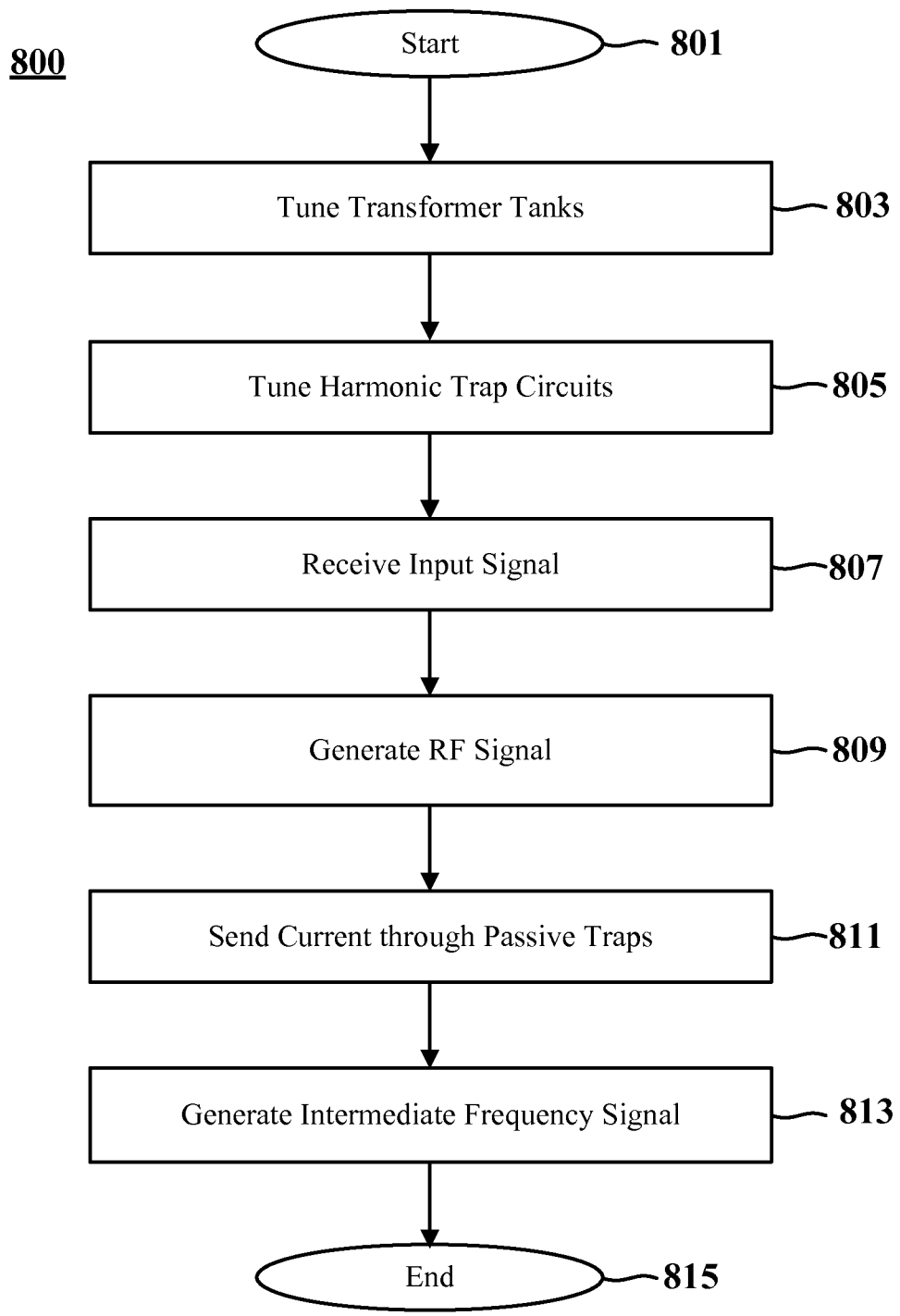
FIG. 8 illustrates an exemplary method for producing a signal using the exemplary stage of a wireless receiver.

FIG. 8 illustrates an exemplary method for producing a signal using the exemplary mixing stage of a wireless receiver. Method 800 can be performed, for example, by circuit 400, 500 to provide a baseband voltage as part of a receiver (RX) chain 250 in wireless receiver 200 while attempting to reject input interference at LO harmonic frequencies, prevent noise folding and reduce TIA output noise.

Method 800 can start at 801 and proceed to step 803, where the tank circuit formed by transformer 409 are tuned. For example, tunable capacitors $C_p$ 409a and $C_s$ 409b of transformer 409 can be tuned such that the primary and secondary windings of transformer 409 resonate at the same frequency.

In step 805, harmonic trap circuits 411-412 can be tuned. In some embodiments, each trap 411, 412 in a trap circuit pair 411-412 is connected in series between an output of transformer 409 and an input of mixer 413, with each trap circuit 411, 412 being tuned to have the same resonant frequency. The resonant frequency can be tuned in step 805 to be a frequency that falls at a harmonic of the LO frequency.

In some embodiments, the mixing circuit can include a passive network 511 comprising a cascade configuration of series harmonic trap pairs 411-412 that are connected in series. In such instances, each of the trap pairs 411-412 can be tuned independently to have a resonant frequency that falls at a different harmonic of the LO frequency. In some embodiments, passive network 511 can include trap pairs 411-412 whose resonant frequencies are tuned to only odd harmonics of the LO frequency. This can be done, for example, when the mixing circuit includes a balanced mixer 413, 513 that rejects even harmonics of the LO frequency.

Once components of the circuit are tuned, circuit 400 can receive an input signal at step 807. In some embodiments, the input signal is an RF signal received from an amplifier, such as the LNA in circuit 300 or LNA 252 of RX chain 250. In some embodiments, the input signal can be a carrier wave received by antenna 290. In some embodiments, transformer 409 can receive the input signal as a differential signal. In step 809, transformer 409 produces an RF signal for mixer 413. In some embodiments, the secondary winding of transformer 409 produces a differential signal.

Once transformer 409 produces the RF signal, the RF signal in step 811 is sent as a current through passive trap pairs 411-412. In some embodiments, when the RF signal is a differential signal, each component signal that comprises the differential signal is sent through one of the traps 411, 412 comprising trap pair 411-412. In some embodiments, the RF current is sent through passive network 511, with each component signal passing through multiple trap pairs 411-412 connected in series in a cascade configuration. Trap pair 411-412 is configured to suppress currents at their tuned resonant frequency. In such instances, the current sent through the passive traps are attenuated at the specified resonant frequency.

In step 813, mixer 413 produces an intermediate frequency (IF) signal based on the RF current signal received from transformer 409 and an input LO signal at the LO frequency. In some embodiments, mixer 413 is a balanced mixer that produces the baseband output as a differential signal. In some embodiments, mixer 413 is a double-balanced mixer that receives the differential RF current ($i_{rf}$) and produces a differential output baseband current signal ($i_{bb}$). In some embodiments, the output is sent to a trans-impedance amplifier (TIA) 415 that produces an output baseband voltage signal ($V_{bb}$) based on the baseband current signal. Once the output signal is produced, method 800 can end at step 815.

It is understood that the specific order or hierarchy of steps in the processes/flow charts disclosed is an illustration of exemplary approaches. Based upon design preferences, it is understood that the specific order or hierarchy of steps in the processes/flow charts may be rearranged. Further, some steps may be combined or omitted. The accompanying method claims present elements of the various steps in a sample order, and are not meant to be limited to the specific order or hierarchy presented.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but is to be accorded the full scope consistent with the language claims, wherein reference to an element in the singular is not intended to mean "one and only one" unless specifically so stated, but rather "one or more." The word "exemplary" is used herein to mean "serving as an example, instance, or illustration." Any aspect described herein as "exemplary" is not necessarily to be construed as preferred or advantageous over other aspects." Unless specifically stated otherwise, the term "some" refers to one or more. Combinations such as "at least one of A, B, or C," "at least one of A, B, and C," and "A, B, C, or any combination thereof" include any combination of A, B, and/or C, and may include multiples of A, multiples of B, or multiples of C. Specifically, combinations such as "at least one of A, B, or C," "at least one of A, B, and C," and "A, B, C, or any combination thereof" may be A only, B only, C only, A and B, A and C, B and C, or A and B and C, where any such combinations may contain one or more member or members of A, B, or C. All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed as a means plus function unless the element is expressly recited using the phrase "means for."

What is claimed is:

1. An apparatus for reducing a harmonic response in an electronic circuit, the apparatus comprising:
    an RF input configured to provide a first signal operating at a radio frequency;
    a local oscillator configured to produce a second signal operating at a local oscillator (LO) frequency;
    a switching mixer configured to mix the first and second signals; and
    a first notch filter in a path between the RF input and the switching mixer comprising:
        an inductor, and
        a capacitor connected to the inductor,
        the first notch filter being directly coupled to an input of the switching mixer, wherein the first notch filter is tuned such that its resonant frequency is a harmonic of the LO frequency signal.

2. The apparatus of claim 1, further comprising:
    a transformer configured to receive the first signal from the RF input.

3. The apparatus of claim 2, further comprising:
    a second notch filter, comprising:
        a second inductor, and
        a second capacitor connected to the second inductor in parallel,
        the second notch filter being directly coupled to an input of the switching mixer in series, wherein the second notch filter is tuned such that its resonant frequency is a harmonic of the LO frequency signal,
    wherein the transformer comprises:
        a first winding, and
        a second winding, wherein each terminal of the second winding is connected to an input of the first and second notch filters, respectively.

4. The apparatus of claim 3, wherein each capacitor in the first and second notch filters are tunable to configure the first and second notch filters to have the resonant frequency of each notch filter fall at a harmonic of the LO frequency signal.

5. The apparatus of claim 3, wherein the first signal comprises a differential signal.

6. The apparatus of claim 3, rein inductors in the first and second notch filters have mutual coupling.

7. The apparatus of claim 2, wherein the transformer comprises a double-tuned transformer.

8. The apparatus of claim 7, wherein the transformer is configured to have a coupling co-efficient below 0.7.

9. The apparatus of claim 1, further comprising:
    a trans-impedance amplifier directly coupled to the switching mixer configured to produce a baseband voltage from a baseband current produced by the switching mixer.

10. The apparatus of claim 1, wherein the first notch filter is tuned to have a resonant frequency fall at a third harmonic of the LO frequency signal.

11. The apparatus of claim 1, wherein the LO frequency signal comprises a signal with a 25% duty cycle.

12. The apparatus of claim 1, further comprising:
    at least one pair of notch filters connected in series with the first notch filler, the at least one pair of notch filters and the first notch filter being part of a plurality of N pairs of notch filters connected in series, wherein each of N notch filter pairs is tuned to have a resonant frequency fall at a separate harmonic of the LO frequency signal, wherein the switching mixer receives a radio frequency signal as an output of the N notch filter pairs.

13. The apparatus of claim 1, further comprising:
    an antenna configured to:
        receive a carrier signal, and
        provide, to the RF input, the first signal comprising the carrier signal.

14. The apparatus of claim 1, wherein the switching mixer produces a down-converted signal.

15. The apparatus of claim 1, wherein the switching mixer comprises a passive mixer.

16. A method for reducing a harmonic response in an electronic circuit, the method comprising:
    providing, by a first notch filter, a first signal operating at a radio frequency, the first notch filter comprising an inductor and a capacitor connected to the inductor and wherein the first notch filter is in a path between an RF input and a switching mixer;
    receiving, by the switching mixer, a second signal operating at a local oscillator (LO) frequency, and
    mixing, by the switching mixer, the first and second signals, wherein the first notch filter is directly coupled to an input of the switching mixer and the first notch filter is tuned such that its resonant frequency is a harmonic of the LO frequency.

17. The method of claim 16, further comprising:
    receiving, by a transformer, the RE input; and
    producing, by the transformer, a transformer output signal, wherein the first notch filter modifies the transformer output signal.

18. The method of claim 17, wherein the transformer comprises a double-tuned transformer.

19. The method of claim 18, further comprising:
    configuring the transformer to have a coupling co-efficient below 0.7.

20. The method of claim 17, wherein the switching mixer comprises a passive mixer.

21. The method of claim 17, further comprising:
    providing, by a second notch filter, the first signal, wherein the second notch filter comprises a second inductor and a second capacitor connected to the second inductor in parallel and is directly coupled to an input of the switching mixer in series and the second notch filter is tuned such that its resonant frequency is a harmonic of the LO frequency signal,
    further wherein the transformer comprises a first winding and a second winding, each terminal of the second winding being connected to an input of the first and second notch filters, respectively.

22. The method claim 21, further comprising:
tuning each capacitor in the first and second notch filters to configure the first and second notch filters to have the resonant frequency of each notch filter fall at a harmonic of the LO frequency signal.

23. The method of claim 21, wherein the first signal comprises a differential signal.

24. The method of claim 16, further comprising:
receiving, by a trans-impedance amplifier directly coupled to the switching mixer, a baseband current based on the mixed first and second signals; and
converting, by the trans-impedance amplifier, the baseband current into a baseband voltage.

25. The method of claim 16, further comprising:
tuning the first notch filter to have a resonant frequency fall at a third harmonic of the LO frequency signal.

26. The met d of claim 21, wherein inductors in the first and second notch filters have mutual coupling.

27. The method of claim 16, wherein the LO frequency signal comprises a signal with a 25% duty cycle.

28. The method of claim 16, further comprising:
tuning a plurality of N pairs of notch filters connected in series, each of N notch filter pairs being tuned to have a resonant frequency fall at a separate harmonic of the LO frequency signal; and
receiving, by the switching mixer, the radio frequency signal as an output of the N notch filter pairs.

29. The method of claim 16, further comprising:
receiving, by an antenna, a carrier signal, and
providing, by the antenna to the RF input, the first signal comprising the carrier signal.

30. The method of claim 16, further comprising:
producing, by the switching mixer, a down-converted signal based on the mixed first and second signals.

31. An apparatus for reducing a harmonic response in an electronic circuit, the apparatus comprising:
means for providing, by at least one notch filter, a first signal operating at a radio frequency, the at least one notch filter comprising an inductor and a capacitor connected to the inductor and wherein the at least one notch filter is in a path between an RF input and a switching mixer;
means for receiving, by the switching mixer, a second signal operating at a local oscillator (LO) frequency, and
means for mixing, by the switching mixer, the first and second signals, wherein the at least one notch filter is directly coupled to an input of the switching mixer and the at least one notch filter is tuned such that its resonant frequency is a harmonic of the LO frequency.

32. An apparatus for reducing a harmonic response in an electronic circuit, the apparatus comprising:
means for configuring an RF input to provide a first signal operating at a radio frequency; a local oscillator configured to produce a second signal operating at a local oscillator (LO) frequency;
means for configuring a switching mixer to mix the first and second signals; and means for implementing at least one notch filter comprising:
an inductor, and
a capacitor connected to the inductor in parallel,
the at least one notch filter being directly coupled to an input of the switching mixer in series, wherein the notch filter is tuned such that its resonant frequency is a harmonic of the LO frequency signal.

\* \* \* \* \*